United States Patent
Bu et al.

(10) Patent No.: US 7,123,072 B2
(45) Date of Patent: Oct. 17, 2006

(54) HIGH-ACCURACY CAPACITOR DIGITAL-TO-ANALOG CONVERTER

(75) Inventors: Linkai Bu, Tainan (TW);
Chuan-Cheng Hsiao, Jiayi (TW);
Kun-Cheng Hung, Hsinchu (TW);
Chien-Pin Chen, Tainan (TW)

(73) Assignee: Himax Opto-Electronics Corp., Tainan County (TW)

( * ) Notice: Subject to any disclaimer, the term of this patent is extended or adjusted under 35 U.S.C. 154(b) by 196 days.

(21) Appl. No.: 10/128,663

(22) Filed: Apr. 23, 2002

(65) Prior Publication Data
US 2002/0158786 A1 Oct. 31, 2002

(30) Foreign Application Priority Data
Apr. 25, 2001 (TW) .................................. 90109951 A

(51) Int. Cl.
*G06G 7/18* (2006.01)
(52) U.S. Cl. .................................. 327/337; 341/144
(58) Field of Classification Search ................ 327/74, 327/75, 337, 91; 341/126, 155, 143, 144, 341/145
See application file for complete search history.

(56) References Cited

U.S. PATENT DOCUMENTS

| | | | | |
|---|---|---|---|---|
| 5,767,801 A | * | 6/1998 | Okamoto | 341/145 |
| 6,081,218 A | * | 6/2000 | Ju et al. | 341/143 |
| 6,271,784 B1 | * | 8/2001 | Lynn et al. | 330/150 |
| 6,448,917 B1 | * | 9/2002 | Leung et al. | 341/144 |

\* cited by examiner

*Primary Examiner*—Timothy P. Callahan
*Assistant Examiner*—Linh Nguyen
(74) *Attorney, Agent, or Firm*—Baker & McKenzie

(57) ABSTRACT

A capacitor digital-to-analog converter for N-bit digital-to-analog conversion comprises a converter capacitor network comprising $2^N$ capacitors and $2^N+1$ MOS switches and an output buffer. The MOS switches are connected in a series chain at their respective source/drain, and each of the capacitors has a first electrode connected to a corresponding joining node between two consecutive MOS switches in the series chain and a second electrode connected together to a common node. The output buffer comprises a differential amplifier and an output amplifier, the differential amplifier has $2^N$ discrete inputs each connected to a corresponding one of the first electrodes of the capacitors in the converter capacitor network.

15 Claims, 6 Drawing Sheets

HIGH-ACCURACY CAPACITOR DIGITAL-TO-ANALOG CONVERTER

FIELD OF THE INVENTION

This invention relates in general to digital-to-analog signal conversion and, in particular, to a high-accuracy capacitor digital-to-analog converter.

BACKGROUND OF THE INVENTION

Digital-to-analog (DA) conversion is a technique for converting information expressed in digital format into analog signals. Digital-to-analog converters (DAC) is indispensable for digital electronic equipment that need to process information obtained in the form of analog signals. As is known, voice, audio and video signals, information closely related to our daily life, are inherently analog in form. Contemporary technologies have, however, employed digital form for the processing and storage of these most-used information. For example, a music Compact Disc (CD) player retrieves sound information stored on a CD in digital format for playback. Before this high-fidelity music can be played back, however, its retrieved digital representation must be converted into analog electrical signal that can be used to drive a loudspeaker system. Good digital-to-analog conversion is crucial to high-fidelity music playback.

In another example, an LCD (liquid crystal display) panel of a computer system also requires similar digital-to-analog conversion. Much like a pair of loudspeakers is to the ears of a music lover, the LCD panel is the instrument for presenting visual information to the operator/user of the computer. Information in the form of either text, graphics or video to be displayed on the LCD panel is stored and processed in the computer system in digital. To drive the transistors in a matrix that correspond to the screen pixels of a TFT LCD, the digital display information must be converted into analog.

Two categories of DAC, the resistor and capacitor DAC's, are frequently used for such DA conversion. Resistor DAC (hereafter referred to as RDAC) are relatively simpler to make but consume static power. Electric power is consumed across the resistor of the RDAC even as the converter is in static status. By contrast, capacitor DAC (CDAC) are inherently more complex to fabricate, and their operation require more precise timing control, but they consume virtually no static power, which is an important characteristics of advantage in portable electronic devices.

There are in general three causes of wrong voltage levels in a CDAC that lead to conversion inaccuracy. The first is the voltage difference between CDAC capacitor and gate input of the output buffer. The second is caused by charge injection for CDAC control signal. The third cause is charge injection from output buffer node voltage transition. In general, the conversion accuracy of a CDAC is greatly affected by the charge sharing and the charge injection phenomena inherent to CDAC.

To overcome these problems and increase CDAC conversion accuracy, a straight-forward solution is the use of large capacitors in CDAC in order to secure large capacitance. Unfortunately, large capacitors increase die sizes for these CDAC. As the conversion voltage increases, this problem becomes even more significant. This prevents the successful application of CDAC in applications such as TFT LCD because conversion voltage required in TFT driver circuitry is typically high.

For the purpose of the description of the invention, it suffices to examine the circuit configuration of the conventional CDAC devices and the principle problems they encounter. FIG. 1 is a schematic diagram of a conventional N-bit CDAC with an output buffer. The illustration of FIG. 1 also outlines the charge sharing problem these conventional CDAC have.

As is seen in the drawing, an N-bit CDAC converter 100 is essentially consisted of a converter capacitor network 110 and an output buffer 120. Output of the capacitor network 110, as extracted at node 112, is connected to input of the buffer 120. The capacitor network 110 requires a total of $2^N$ capacitors $C_1, C_2, \ldots, C_{2^N}$ and $2^N+1$ MOS switches, including the low and high input switches $S_L$ and $S_H$, as well as the $2^N-1$ network switches $S_1, S_2, \ldots, S_{2^N-1}$. All the $2^N+1$ MOS switches are connected in a series chain at their respective source/drain, with the two, $S_L$ and $S_H$ respectively for the low and high input voltages $V_L$ and $V_H$, at each of the far ends of the chain controlling the input to the converter capacitor network 110.

Each of the $2^N$ capacitors has its one electrode connected to a corresponding joining node between two consecutive MOS switches in the series chain. For example, capacitor $C_2$ has an electrode connected to the node where switches $S_1$ and $S_2$ are connected together at their respective source/drain terminals. The other electrode of all the capacitors are tied together to a common node—the common ground node in the example of the system. All the $2^N$ capacitors need to be constructed within a specified tolerance to the same capacitance.

For the N-bit CDAC 100 of FIG. 1 to achieve high-precision digital-to-analog conversion, at least two problems, charge injection and charge sharing, must be handled properly. FIG. 1 itself schematically outlines the charge sharing problem in the N-bit CDAC. The output buffer 120 coupled to the N-bit capacitor network 110 introduces an inevitable input capacitance, as is schematically represented by the equivalent capacitor 125, to the system such that the analog voltage as converted by the converter capacitor network 110 becomes essentially drifted away at the output node 128 of the buffer 120. In order to reduce this drift, larger capacitors must be used. However, larger capacitors lead directly to increased device surface area.

On the other hand, FIG. 2 is a schematic diagram of the capacitor network of a conventional N-bit CDAC outlining the problem of charge injection. Charge injection into the capacitors $C_1, C_2, \ldots, C_{2^N}$ of the converter capacitor network 210 is caused by junction coupling across the gate-source and/or gate-drain terminals while any of the MOS devices $S_L, S_1, S_2, \ldots, S_{2^N-1}, S_H$ are switching. This charge injection phenomenon is schematically illustrated in the drawing by the capacitance $C_{GS}$ and $C_{GD}$ of the equivalent gate-source and gate-drain capacitors $C_{GL}, C_{G21}, C_{G22}$ and $C_{GH}$ connected across the gate and either source or drain of a MOS switch device. This charge injection is sometimes considered a clock feedthrough, a phenomenon in which the gate control signal applied to a MOS switch of a converter capacitor network is coupled across its equivalent gate-source or gate-drain capacitance into the network capacitor.

Traditionally, two approaches have been employed to tackle this charge injection problem. The first utilizes a companion switch for each of the converter MOS switches that has half the size of its master device. The companion switch is controlled to operate against its master so as to cancel the charge injection introduced by the activation of the master utilizing its own inherent injection. However, the only function of the additional companion switch is the provision of a cancellation injection of charge for its master and nothing else. Overall circuitry complexity and device size are substantially increased as a result of this additional device.

A second approach employs the concept of a transmission gate for each of the MOS switch devices of the converter. A device of the reverse polarity as that of the switch whose charge injection was to be cancelled is connected in parallel. When both devices functions, the reversed injections cancels each other. However, this approach not only requires an additional MOS devices for each switch in the converter, there were also introduced additional problems of mismatched $C_{GS}/C_{GD}$ capacitance for the pair.

Thus, as the charge injection and sharing problems are not effectively resolved in the prior-art CDAC, it is therefore an object of the invention to provide a CDAC that resolves these problems simultaneously.

It is another object of the invention to provide a CDAC that is free from the charge injection and sharing problems while is simple to construct.

It is still another object of the invention to provide a CDAC that is free from the charge injection and sharing problems while is low in cost to construct.

SUMMARY OF THE INVENTION

The invention achieves the above-identified objects by providing a capacitor digital-to-analog converter for N-bit digital-to-analog conversion that comprises a converter capacitor network comprising $2^N$ capacitors and $2^N+1$ MOS switches and an output buffer. The MOS switches are connected in a series chain at their respective source/drain, and each of the capacitors has a first electrode connected to a corresponding joining node between two consecutive MOS switches in the series chain and a second electrode connected together to a common node. The output buffer comprises a differential amplifier and an output amplifier, the differential amplifier has $2^N$ discrete inputs each connected to a corresponding one of the first electrodes of the capacitors in the converter capacitor network.

DETAILED DESCRIPTION OF THE INVENTION

Figure 3:
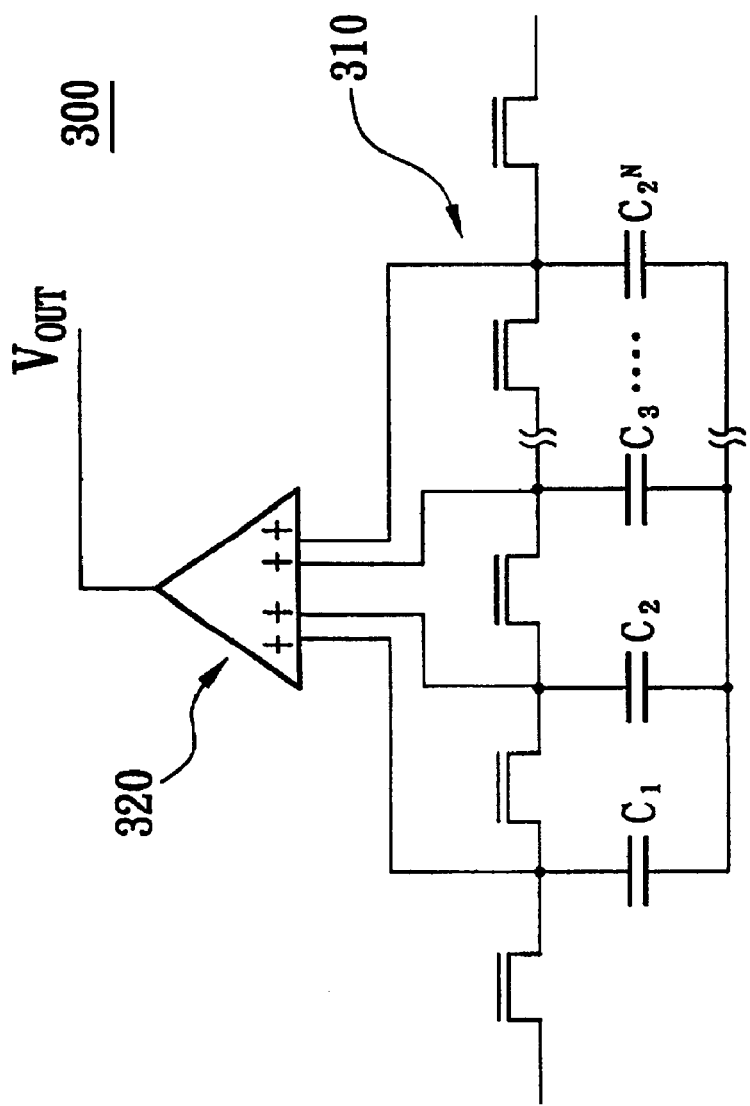
FIG. 3 is a schematic diagram illustrating an N-bit CDAC of the invention employing a discrete-input buffer for the converter capacitor network.

The high-accuracy CDAC of the invention as described in the following paragraphs in preferred embodiments is capable of providing high-accuracy DA conversion by simultaneously resolving the charge injection and charge sharing problems in the conventional CDAC. First, to avoid the charge sharing problem, a CDAC of the invention employs a buffer circuit for its converter capacitor network with a discrete input for each and every capacitors in the network. FIG. 3 is a schematic diagram illustrating an N-bit CDAC 300 of the invention employing such a discrete-input buffer 320 for its converter capacitor network 310.

Figure 4:
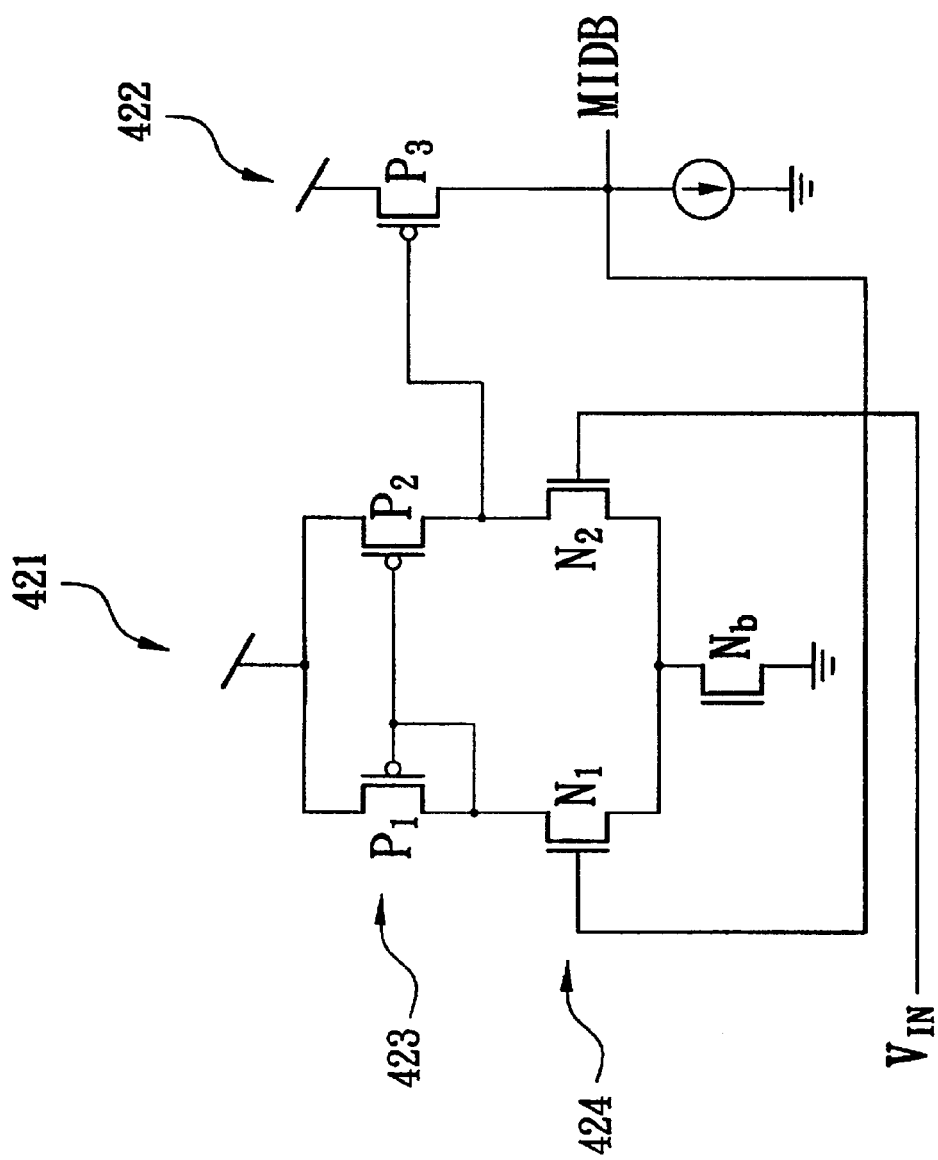
FIG. 4 is a schematic diagram illustrating the basic circuit configuration for a multiple discrete-input buffer for the CDAC of FIG. 3.

In the CDAC 300 of FIG. 3, each of all the switched electrodes of the $2^N$ capacitors $C_1, C_2, \ldots, C_{2^N}$ in the network 310 is connected discretely to an independent input of the buffer 320. FIG. 4 is a schematic diagram illustrating the basic circuit configuration for such a multiple-input buffer. Although only one input at the MOS device $N_2$ is shown in this depicted basic configuration, however, as will be described in detail in the following paragraphs, the device $N_2$, whose gate terminal labeled as $V_{IN}$, can be expanded into multiple MOS devices for receiving the input signal from the converter capacitor network for input.

As is seen in the drawing, the buffer 420 is comprised of two stages of amplifiers 421 and 422. The first stage 421 is a differential amplifier consisting of a current mirror 423 and a differential pair 424 of MOS switch devices. The MOS switch devices of the current mirror 423 and that of the differential pair 424 are of the reversed polarities. For example, in the basic buffer of FIG. 4, the current mirror 423 are made up of PMOS devices and the differential pair 424 of NMOS devices.

On the other hand, the second stage 422 is an amplifier consisting of a MOS switch device $P_3$ and a current source CS. The output of the first-stage differential amplifier 421 is used to control the second-stage amplifier 422.

In the first-stage differential amplifier 421, the current mirror 423 has a first, $P_1$, and a second, $P_2$, two PMOS devices and the differential pair 424 has a first, $N_1$, and a second, $N_2$, two NMOS devices. Source terminals of the two PMOS devices $P_1$ and $P_2$ of the current mirror 423 are connected together and to the power source of the system. The gate terminals of PMOS devices $P_1$ and $P_2$ are tied together and also to the drain of the first PMOS $P_1$. On the other hand, source terminals of the two NMOS devices $N_1$ and $N_2$ of the differential pair 424 are connected together and then to ground via another NMOS device $N_b$. Gate terminal of the second NMOS device $N_2$ serves as the input to the buffer 420, and that of the first NMOS $N_1$ receives feedback from the output of the buffer 420 itself from the second stage.

The current mirror 423 and the differential pair 424 are connected to each other at the drain terminals. The drain of the first PMOS device $P_1$ of the current mirror 423 is connected to the drain of the first NMOS device $N_1$ of the differential pair 424 and, likewise, the drain of the second PMOS $P_2$ of the current mirror 423 is connected to the drain of the second NMOS $N_2$ of the differential pair 424.

Figure 1:
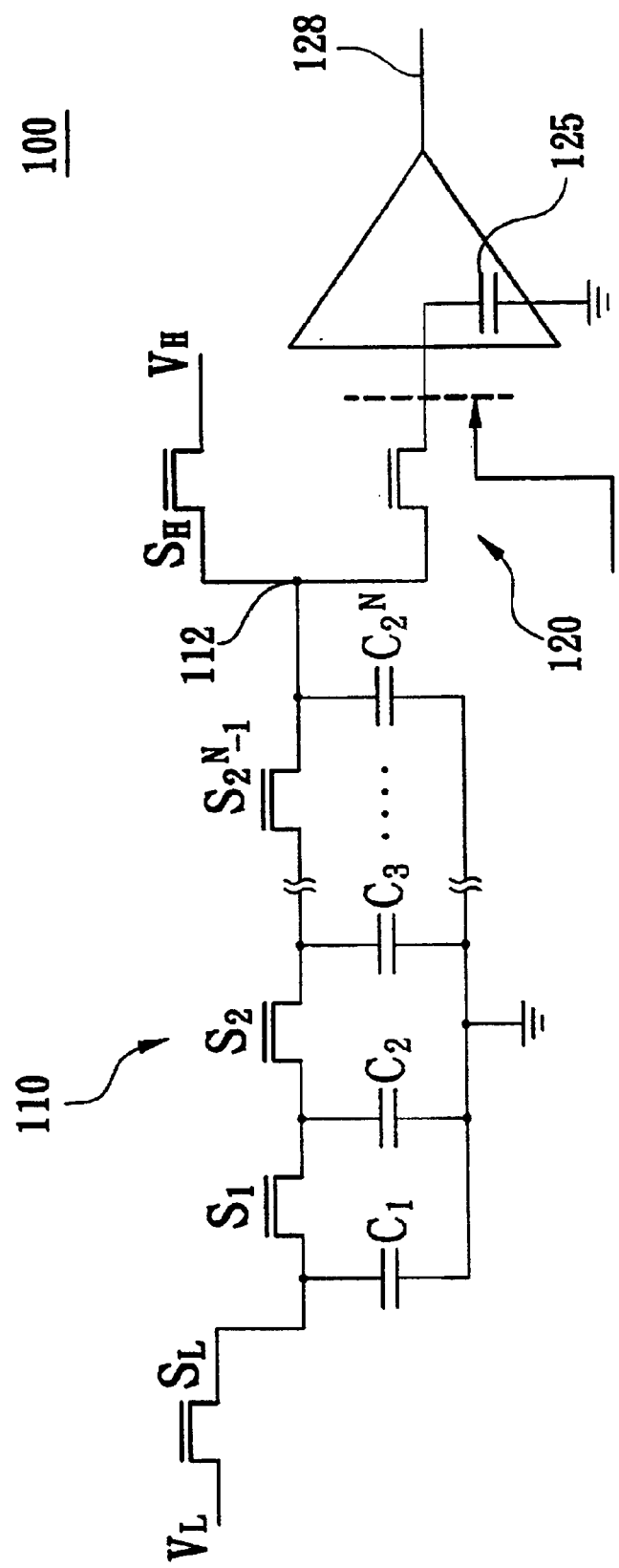
FIG. 1 is a schematic diagram of a conventional N-bit CDAC with an output buffer outlining the problem of charge sharing.
Figure 2:
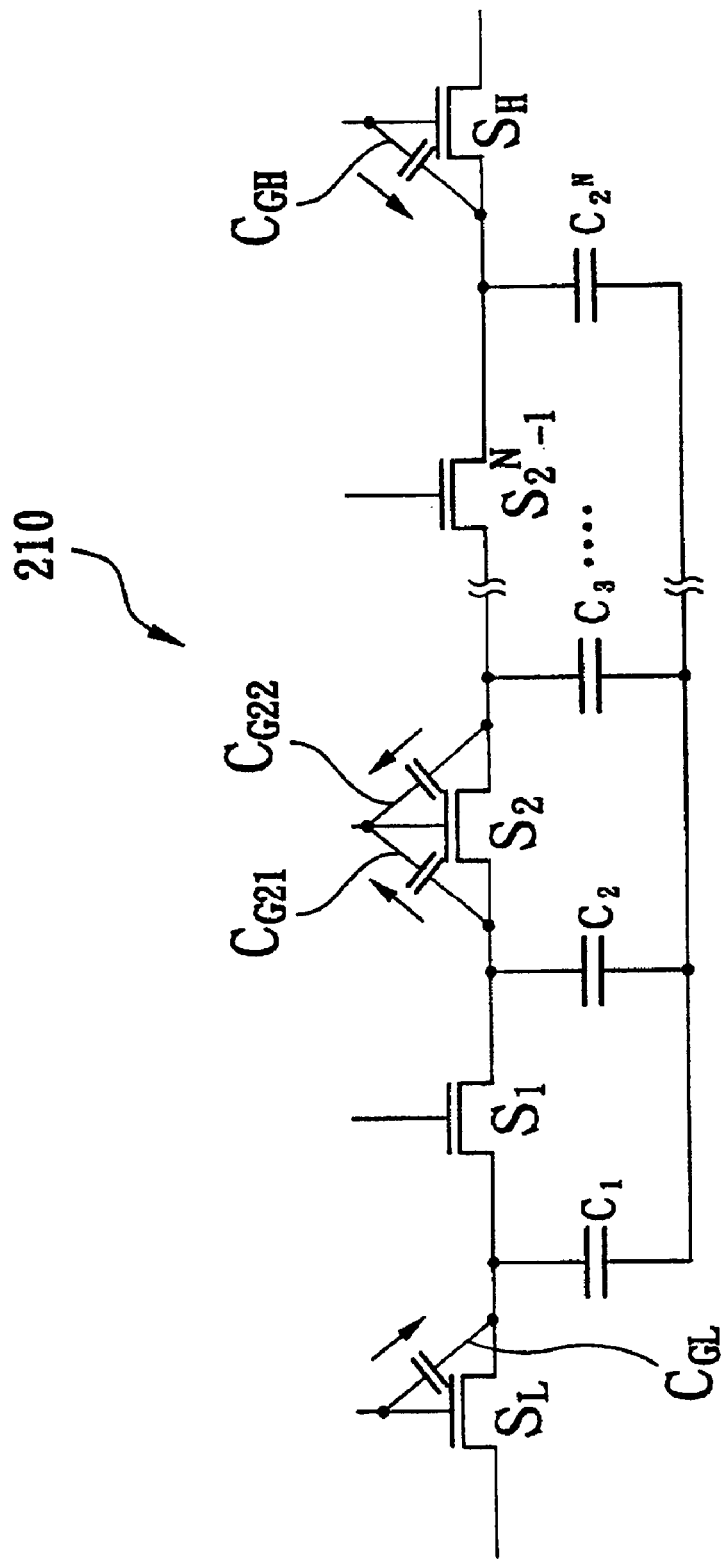
FIG. 2 is a schematic diagram of a conventional N-bit CDAC outlining the problem of charge injection.

Although the buffer basic circuit configuration as outlined in FIG. 4 can be expanded to suit the need of multiple input for the capacitor network in the CDAC in a configuration as outlined in FIG. 3 aiming at resolving the charge sharing problem as described in FIG. 1, however, it has an inherent nature of introducing a charge injection problem of its own. This charge injection phenomenon is in addition to what was described in FIG. 2 above. While the charge injection problem described in FIG. 2 is caused by the operation of the MOS switch devices of the converter capacitor network itself, the additional charge injection is caused by the MOS device of the buffer.

Specifically, the gate terminal of the second NMOS $N_2$ in the first-stage differential amplifier 421 of the buffer 420 of FIG. 4 which serves as the input for the capacitor network of the CDAC injects charges into the capacitor to which it is connected as it is switched. Two injections are possible. One is from the source terminal of $N_2$ as a result of the gate-source capacitance $C_{GS}$, and the other is from the drain of $N_2$ due to gate-drain capacitance $C_{GD}$. Typical voltage deviation induced in the connected capacitor of the converter is in the range of about 1–5 mV, an amount significant enough that must be dealt with if the construction of a high-accuracy CDAC is intended.

Figure 5:
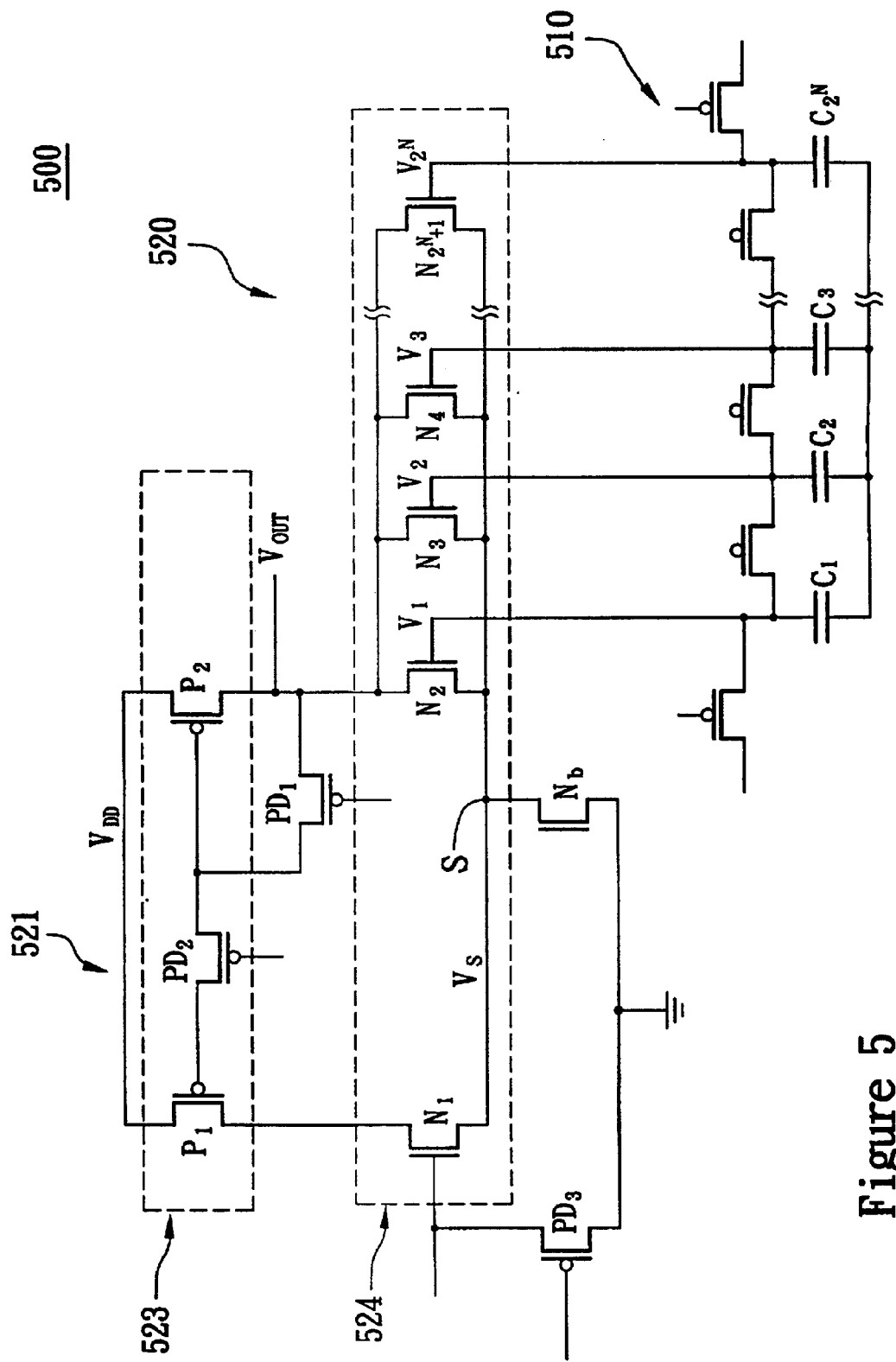
FIG. 5 is a schematic diagram illustrating the detailed circuitry of a high-accuracy CDAC in accordance with a preferred embodiment of the invention.

Though, in accordance with the present invention, with a modification to the basic configuration of FIG. 4, however, it is possible to cancel this additional charge injection problem, as will be described in detail below. Refer to FIG. 5, a schematic diagram illustrating the detailed circuitry of a high-accuracy CDAC in accordance with a preferred embodiment of the invention. The CDAC 500 of FIG. 5 incorporates an output buffer 520 based on the configuration 420 of FIG. 4 for a capacitor network 510 capable of N-bit DA conversion. Note that the buffer 520 has $2^N$ input MOS devices for N-bit DA conversion as compared to the single one of the basic buffer 420 of FIG. 4. Also, three additional MOS devices $PD_1$, $PD_2$ and $PD_3$ are added to the basic buffer that are used to cancel the buffer-induced injection charges into the converter network capacitors as mentioned above.

As is illustrated in FIG. 5, in the first-stage differential amplifier 521, the current mirror 523 has a first, $P_1$, and a second, $P_2$, two PMOS devices. On the other hand, the differential pair 524 has a first, $N_1$, at one differential branch, and a total of $2^N$ NMOS devices $N_2, \ldots, N_{2^N}, N_{2^N+1}$ at the other branch. Note that the second NMOS device $N_2$ of the basic buffer configuration 420 of FIG. 4 is now substantially expanded into $2^N$ NMOS device $N_2, \ldots, N_{2^N}, N_{2^N+1}$ for accommodating the $2^N$ capacitors in the converter capacitor network 510 as discrete inputs to the buffer 520. Hereafter, these expanded NMOS devices will be referred to as input NMOS devices of the buffer 520. This effectively allows each of the capacitors $C_1, \ldots, C_{2^N}$ in the network 510 of the converter 500 to "see" the same gate capacitance at its corresponding input MOS device among $N_2, \ldots, N_{2^N}, N_{2^N+1}$. As a result, the capacitance variation for each of them can thus be avoided. Also note that in order to maintain a balanced differential pair, the effective total physical device dimension of the $2^N$ NMOS device $N_2, \ldots, N_{2^N}, N_{2^N+1}$ countering the first NMOS device $N_1$ should be fabricated to be substantially the same as that of $N_1$.

Source terminals of the two PMOS devices $P_1$ and $P_2$ of the current mirror 523 are connected together and to the power source $V_{DD}$. Gate terminal of the second PMOS $P_2$ is connected to its own drain across a PMOS device $P_{D1}$. Gate terminals of PMOS devices $P_1$ and $P_2$ are tied together via a PMOS device $PD_2$. Gate terminal of the first PMOS device $P_1$ is connected to its own drain. Then, similar as was in the basic buffer of FIG. 4, source terminals of all the NMOS devices $N_1, N_2, \ldots, N_{2^N}, N_{2^N+1}$ of the differential pair 524 are connected together and then to ground via another NMOS device $N_b$.

Gate terminal of each of these $2^N$ input NMOS devices $N_2, \ldots, N_{2^N}, N_{2^N+1}$ serves as a discrete input to the buffer 520, and that of the first NMOS $N_1$ receives feedback from the output of the buffer 520 itself from the second stage. The current mirror 523 and the differential pair 524 are connected at the drain terminals. The drain of the first PMOS device $P_1$ of the current mirror 523 is connected to the drain of the first NMOS device $N_1$ of the differential pair 524 and, likewise, the drain of the as second PMOS $P_2$ of the current mirror 523 is connected to the drain of all the $2^N$ input NMOS devices $N_2, \ldots, N_{2^N}, N_{2^N+1}$ of the differential pair 524.

In comparison to the basic buffer circuit configuration of FIG. 4, another additional PMOS device $PD_3$ connects the gate terminal of the first NMOS device $N_1$ of the buffer 520 to the system ground, as is illustrated in FIG. 5.

In operation, in order to reduce the influence of the problematic charge injection phenomenon internal to the MOS switch devices $S_1, S_2, \ldots, S_{2^N-1}$ in the capacitor network 510, only one among the $2^N-1$—excluding the end—switches will be turned on at any given time when the converter 500 is operating.

During the charging phase of the CDAC 500, MOS switch device $PD_1$ is turned on and $PD_2$ off. This effectively shorts the gate-drain terminals of the device $P_2$ while simultaneously cutting the gate of $P_2$ off from that of the first PMOS device $P_1$ such that output of the buffer 520 at node MIDB may be maintained and locked to the voltage of $V_{DD}-V_{GS}$, where $V_{DD}$ is the power voltage supplied to the buffer 520, and $V_{GS}$ is the voltage drop across the PMOS device $P_2$ of the current mirror 523. After the conclusion of the charging phase of the CDAC 500, device $P_1$ is turned off while $P_2$ turned on, and the current mirror 523 of buffer 520 returns to the status of a single-output differential pair, in order to be coupled to and drive the second-stage amplifier 522. This allows the voltage at the node MIDB under this coupled condition to be converged and settled substantially to the value of $V_{DD}-V_{GS}$.

Also during the charging phase of the CDAC 500, gate voltage of the first NMOS device $N_1$ of the differential pair 524 is essentially pulled down to the ground voltage by the PMOS device $PD_3$ as it is turned off. This effectively allows the input NMOS devices $N_2, \ldots, N_{2^N}, N_{2^N+1}$ at the input branch of the differential pair (countering $N_1$ at the opposing branch) to dominate the voltage $V_S$ of node S, the node where the MOS devices of the differential pair 524 are joined together at their respective drains. In other words, voltage $V_S$ is effectively determined by the minimum voltage, $V_{IN_N}$, of all the input voltages at their respective gate terminal of the MOS switch devices $N_2, \ldots, N_{2^N}, N_{2^N+1}$. When the system is settled after feedback, the voltage $V_{IN_N}$ essentially determines the voltage $V_S$ at node S.

Figure 6:
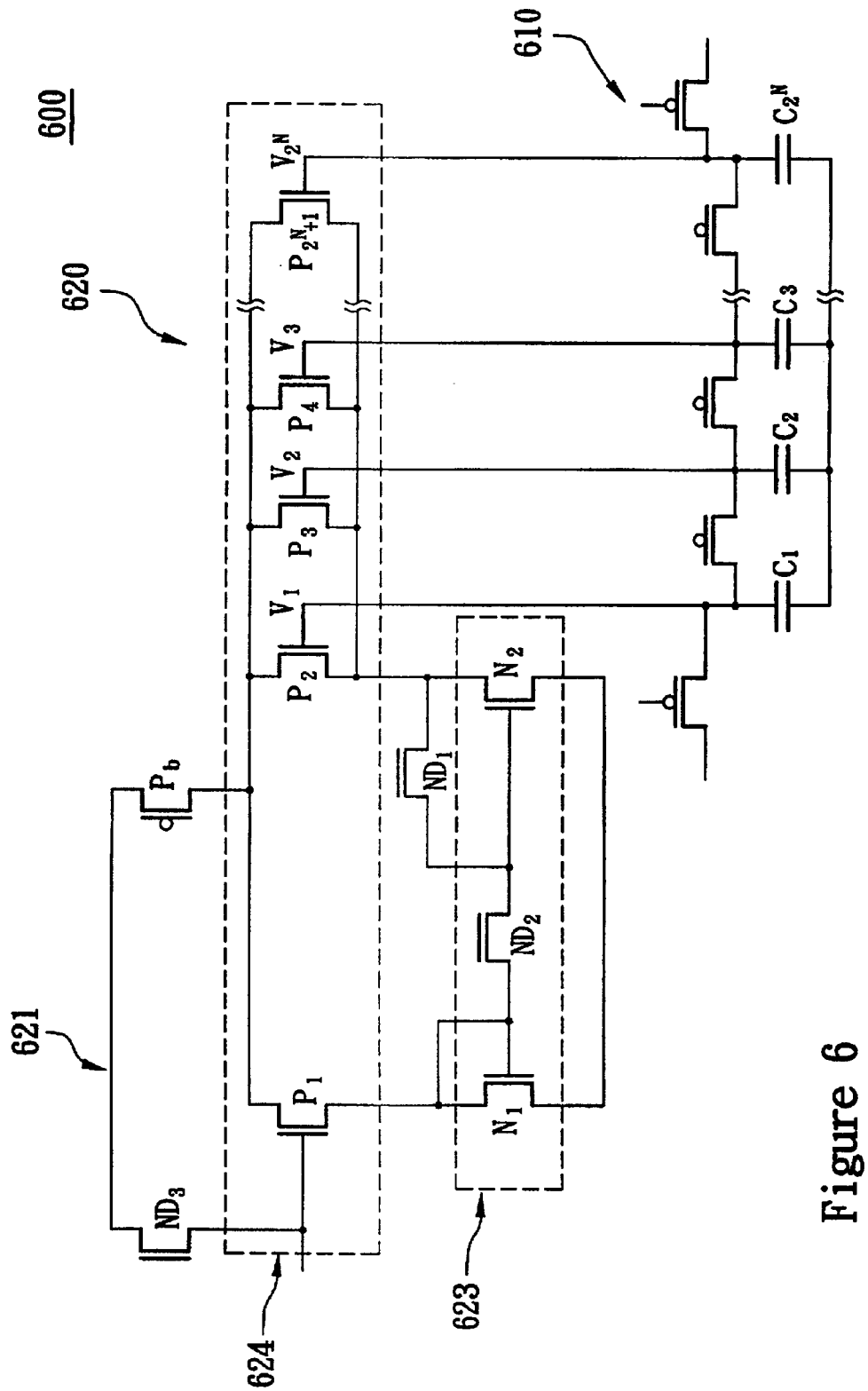
FIG. 6 is a schematic diagram illustrating the detailed circuitry of a high-accuracy CDAC in accordance with another preferred embodiment of the invention.

FIG. 6 is a schematic diagram illustrating the detailed circuitry of a high-accuracy CDAC in accordance with another preferred embodiment of the invention. The embodiment of FIG. 6 is similar to that of FIG. 5 except that the polarity of all the MOS switch devices employed for the construction of the converter is reversed.

Thus, as mentioned above, there are in general three causes of wrong voltage levels in a CDAC. The first is the voltage difference between CDAC capacitor and gate input of the output buffer. In accordance with the present invention, the solution to this problem is the use of a multiple-input output buffer. The second is caused by charge injection for CDAC control signal. The solution of the present invention to this problem is cancellation. The third cause is charge injection from output buffer node voltage transition. As is taught by the present invention, additional switch devices $P_{D1}$, $PD_2$ and $PD_3$ introduced to a basic output buffer circuitry minimize the transition and thus alleviate the injection problem. These measures in combination allow the present invention to provide a CDAC that is small in device size and accurate in conversion accuracy by simultaneous elimination of the charge injection and sharing problems that would otherwise arise.

While the above is a full description of the specific embodiments, various modifications, alternative constructions and equivalents may be used. Therefore, the above description and illustrations should not be taken as limiting the scope of the present invention which is defined by the appended claims.

What is claimed is:

1. A capacitor digital-to-analog converter for converting an N-bit digital signal into an analog signal, said converter comprising:
 a converter capacitor network comprising $2^N$ capacitors and $2^N+1$ MOS switches, said MOS switches being connected in a series chain at their respective source/drain, and each of said capacitors has a first electrode connected to a corresponding joining node between two consecutive MOS switches in said series chain and a second electrode connected together to a common node; and
 an output buffer comprising a differential amplifier and an output amplifier, output of said differential amplifier being connected to said output amplifier, said differential amplifier having $2^N$ discrete inputs each connected to a corresponding one of said first electrodes of said capacitors in said converter capacitor network for converting said N-bit digital signal in said capacitor network into a voltage signal and sending to said output amplifier for amplification and output as converted analog signal.

2. The capacitor digital-to-analog converter of claim 1, wherein said differential amplifier of said output buffer further comprises a current mirror and a differential pair of MOS switch devices.

3. The capacitor digital-to-analog converter of claim 2, wherein said differential pair of MOS switch devices further comprises a first MOS switch device at one differential branch and a plurality of $2^N$ second MOS switch devices of the same polarity at the other differential branch.

4. The capacitor digital-to-analog converter of claim 3, wherein said $2^N$ second MOS switch devices have an effective total physical device dimension the same as the physical device dimension of said first MOS switch device.

5. The capacitor digital-to-analog converter of claim 4, wherein said current mirror further comprises a first and a second MOS switch device of a polarity opposite to the polarity of said first MOS switch device and said $2^N$ second MOS switch devices of said differential pair.

6. The capacitor digital-to-analog converter of claim 5, wherein said first and second MOS switch devices of said current mirror are PMOS switch devices, and said first and second MOS switch devices of said differential pair are NMOS switch devices.

7. The capacitor digital-to-analog converter of claim 6, wherein
 source terminals of said first and second PMOS switch devices of said current mirror are connected together and to the power source of the system of said converter; and
 source terminals of said first and second NMOS switch devices of said differential pair are connected together and to ground of the system of said converter by a third NMOS switch device.

8. The capacitor digital-to-analog converter of claim 6, wherein
 drain terminal of said first PMOS switch device of said current mirror is connected to drain terminal of said first NMOS switch device said differential pair; and
 drain terminal of said second PMOS switch device of said current mirror is connected to the drain terminals of said second NMOS switch devices of said differential pair.

9. The capacitor digital-to-analog converter of claim 6, wherein
 each of the gate terminal of said second NMOS switch devices is connected to a corresponding one of said $2^N$ discrete inputs; and
 gate terminal of said first NMOS switch device receives feedback from the output of said buffer.

10. The capacitor digital-to-analog converter of claim 6, wherein
 gate terminals of said first and second PMOS switch devices of said current mirror are connected together by a third PMOS switch device;
 gate and drain terminals of said second PMOS switch device are connected together;
 gate and drain terminals of said first PMOS switch device are connected together by a fourth PMOS switch device; and
 gate terminal of said first NMOS switch device of said differential pair is connected to said ground by a fifth PMOS device.

11. The capacitor digital-to-analog converter of claim 5, wherein said first and second MOS switch devices of said current mirror are NMOS switch devices, and said first and second MOS switch devices of said differential pair are PMOS switch devices.

12. The capacitor digital-to-analog converter of claim 11, wherein
 source terminals of said first and second NMOS switch devices of said current mirror are connected together and to the ground of the system of said converter; and
 source terminals of said first and second PMOS switch devices of said differential pair are connected together and to power source of the system of said converter by a third NMOS switch device.

13. The capacitor digital-to-analog converter of claim 11, wherein
 source terminal of said first NMOS switch device of said current mirror is connected to source terminal of said first PMOS switch device of said differential pair; and
 source terminal of said second NMOS switch device of said current mirror is connected to the source terminals of said second PMOS switch devices of said differential pair.

14. The capacitor digital-to-analog converter of claim 11, wherein
 each of the gate terminal of said second PMOS switch devices is connected to a corresponding one of said $2^N$ discrete inputs; and
 gate terminal of said first PMOS switch device receives feedback from the output of said buffer.

15. The capacitor digital-to-analog converter of claim 11, wherein
 gate terminals of said first and second NMOS switch devices of said current mirror are connected together by a third NMOS switch device;
 gate and drain terminals of said second NMOS switch device are connected together;
 gate and drain terminals of said first NMOS switch device are connected together by a fourth NMOS switch device; and
 gate terminal of said first PMOS switch device of said differential pair is connected to said ground by a fifth NMOS device.

* * * * *